US 6,609,950 B2

(12) United States Patent
Kimura et al.

(10) Patent No.: US 6,609,950 B2
(45) Date of Patent: Aug. 26, 2003

(54) METHOD FOR POLISHING A SUBSTRATE

(75) Inventors: Norio Kimura, Kanagawa (JP); Yu Ishii, Kanagawa (JP); Hirokuni Hiyama, Tokyo (JP); Katsuya Okumura, Tokyo (JP); Hiroyuki Yano, Kanagawa (JP)

(73) Assignees: Ebara Corporation, Tokyo (JP); Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/897,918

(22) Filed: Jul. 5, 2001

(65) Prior Publication Data

US 2002/0016074 A1 Feb. 7, 2002

(30) Foreign Application Priority Data

Jul. 5, 2000 (JP) ........................................ 2000-203754

(51) Int. Cl.⁷ ......................... B24B 49/00; B24B 51/00; B24B 1/00
(52) U.S. Cl. ..................... 451/5; 451/6; 451/8; 451/36; 451/41; 451/60; 451/63
(58) Field of Search ..................... 216/88, 89; 438/692, 438/693; 451/6, 8, 9, 10, 11, 36, 41, 59, 60, 63, 285, 287, 288, 289, 290, 5

(56) References Cited

U.S. PATENT DOCUMENTS

| 5,081,796 A | 1/1992 | Schultz |
| 5,609,511 A * | 3/1997 | Moriyama et al. ............. 451/5 |
| 5,672,091 A | 9/1997 | Takahashi et al. |
| 5,738,573 A * | 4/1998 | Yueh ........................... 451/285 |
| 5,868,609 A * | 2/1999 | Aaron et al. ................. 451/285 |
| 5,951,368 A * | 9/1999 | Watanabe et al. ............. 451/10 |
| 6,045,439 A | 4/2000 | Birang et al. |
| 6,213,844 B1 * | 4/2001 | Lenkersdorfer ............. 451/287 |
| 6,217,411 B1 | 4/2001 | Hiyama et al. |

FOREIGN PATENT DOCUMENTS

JP 08-139060 5/1996

OTHER PUBLICATIONS

Ichiju Satoh et al. Polishing Apparatus Including Attitude Controller for Turntable and/or Wafer Carrier. U.S. patent application No. 09/522,705, filed Mar. 10, 2000.

* cited by examiner

Primary Examiner—Timothy V. Eley
(74) Attorney, Agent, or Firm—Wenderoth, Lind & Ponack, L.L.P.

(57) ABSTRACT

A method of polishing substrates enables the size of a polishing table to be reduced. A surface of a substrate to be polished is brought into contact with a polishing surface of a polishing table in such a manner that a portion of the surface of the substrate extends outwardly from an outer periphery of the polishing surface. The substrate is rotated about its center axis while keeping its surface in contact with the polishing surface of the polishing table. The attitude of the substrate carrier is controlled so that the surface of the substrate is kept parallel with the polishing surface of the polishing table during a polishing operation.

10 Claims, 18 Drawing Sheets

Fig. 11

| | SLURRY | SUBSTRATE URGING FORCE | NUMBER OF REVOLUTIONS |
|---|---|---|---|
| FIRST POLISHING STEP | SILICA BASE SLURRY FOR COPPER POLISHING | 400 g/cm² | 70 rpm |
| ↓ | | | |
| SECOND POLISHING STEP | SILICA BASE SLURRY FOR COPPER POLISHING | 200 g/cm² | 70 rpm |
| ↓ | | | |
| END POINT | | | |
| ↓ | | | |
| POLISHING SURFASE CLEANING | | | |
| ↓ | | | |
| THIRD POLISHING STEP | SILICA BASE SLURRY FOR Ta POLISHING | 200 g/cm² | 50 rpm |

METHOD FOR POLISHING A SUBSTRATE

BACKGROUND OF THE INVENTION

The present invention relates to a method and an apparatus for polishing substrates such as semiconductor wafers.

FIGS. 1(a)–1(c) show a typical example of a process of fabricating an interconnect or wiring circuit on a semiconductor substrate W. In FIG. 1(a), the semiconductor substrate W comprises a base layer 101, an electrically conductive layer 101a, a $SiO_2$ insulating layer 102 in which a contact hole 103 and a groove 104 forming a circuit wiring or interconnect pattern have been formed by lithograph-etching, a barrier layer 105 made of TiN or the like, and a seed layer 107. The semiconductor substrate W is, as shown in FIG. 1(b), plated with metal having a high electrical conductivity, in this example copper, so that a copper layer is formed over the substrate W with the contact 103 hole and the groove 104 being filled with the copper 106. The semiconductor substrate is thereafter subjected to chemical-mechanical polishing to remove the copper layer together with the seed layer 107 and the barrier layer 105 on the surface of the insulating layer 102, leaving the copper 106 in the contact hole 103 and the groove 104 in such a manner that the outer surface of the copper 106 in the hole 103 and the groove 104 is flush with the surface of the insulating layer 102, whereby the copper 106 forms a circuit wiring or interconnect of the substrate.

It is necessary for the polishing process mentioned above to be conducted through several steps in which different polishing conditions are respectively set since the polishing is conducted on a plurality of layers formed on the insulating layer 102 including the copper layer, the seed layer and the barrier layer. In a conventional polishing apparatus, there are provided a plurality of polishing tables suitable for those polishing steps. Accordingly, the conventional polishing apparatus is large, complex in construction, expensive and inefficient or of low throughput.

Further, in a polishing operation of the prior art, a substrate carrier brines the entire surface of a substrate to be polished into contact with the polishing surface of the turntable at a position spaced away from the center of the polishing surface in order to increase the polishing speed. Thus, the polishing surface of the turntable is required to have a large diameter. For example, to polish a substrate having a diameter of 200 mm, the polishing surface is required to have a diameter of about 600 mm. Furthermore, if it is required to make a real-time measurement of a thickness of a surface layer of a substrate which is being polished, a special arrangement of a thickness measuring device (for example, embedding a thickness measuring device into a turntable) must be prepared.

SUMMARY OF THE INVENTION

In the light of the above, the present invention aims to provide a polishing apparatus and a method which enable layers of a substrate to be polished with a single-turntable having a small diameter while conducting a real-time thickness measurement of the layers which are being subjected to polishing, thereby solving the problems involved in the prior art such as low throughput, complexity and size of the polishing apparatus.

In accordance with the present invention, there is provided a method of polishing a substrate comprising: bringing a surface of a substrate to be polished into contact with a polishing surface of a polishing table in such a manner that a portion of the surface of the substrate extends outwardly from an outer periphery of the polishing surface; rotating the substrate about its center axis while keeping the surface of the substrate in contact with the polishing surface of the polishing table; and controlling an attitude of the substrate which is being rotated.

The method may further comprise measuring a thickness of a surface layer of the substrate on the basis of measurement of the thickness of the surface layer of a portion of the substrate extending outwardly from the periphery of the polishing surface while the substrate is being rotated.

The method may furthermore comprises supplying a polishing liquid between the surface of the substrate and the polishing surface of the polishing table, wherein substrate polishing conditions are changed in response to the progress of the polishing of the surface of the substrate by changing a force for urging the surface of the substrate against the polishing surface, a number of revolutions per minute of the substrate, a number of revolutions per minute of the polishing table and/or a kind of the polishing liquid. It is preferable that when the polishing liquid is changed from a certain kind of polishing liquid to another kind of polishing liquid, the polishing surface of the polishing table is subjected to a cleaning operation to remove residue of the polishing liquid used in the preceding steps of the polishing of the surface of the substrate to avoid the production of an undesired compound.

In accordance with another aspect of the present invention, there is provided an apparatus for polishing a substrate comprising: a polishing table having a polishing surface; a substrate carrier for holding a substrate and bringing it into contact with the polishing surface in such a manner that a surface of the substrate to be polished is brought into contact with the polishing surface of the polishing table, with a portion of the surface of the substrate extending outwardly from the outer periphery of the polishing surface; and an attitude controller for controlling an attitude of the substrate carrier to keep the surface of the substrate parallel with the polishing surface of the polishing table.

The apparatus may comprise a layer thickness measuring device for determining a thickness of a surface layer of the substrate by measuring the surface layer of the portion of the substrate extending outwardly from the outer periphery of the polishing surface of the polishing table.

Specifically, the apparatus further comprises: a rotatable drive shaft and a universal joint drivingly connecting the drive shaft to the substrate carrier so that the universal joint transmits rotation of the rotatable drive shaft to the substrate carrier while allowing the substrate carrier to tilt relative to the drive shaft. The attitude controller controls the attitude of the substrate carrier by controlling an angle of tilt of the substrate carrier relative to the drive shaft. The attitude controller may comprise a stationary electromagnetic device and an armature securely provided on the substrate carrier so that the armature is moved by means of electromagnetic force generated by the stationary electromagnetic device, whereby the attitude of the substrate carrier is controlled.

According to a further aspect of the present invention, there is provided a method of polishing a substrate comprising: bringing an entire area of a surface of a substrate to be polished into contact with a polishing surface of a polishing table; causing relative movement between the surface of the substrate and the polishing surface while keeping the surface of the substrate in contact with the polishing surface to polish the surface of the substrate;

shifting the substrate relative to the polishing surface while keeping the surface of the substrate in contact with the polishing surface so that the surface of the substrate partly extends outwardly from the outer periphery of the polishing surface; and measuring a thickness of a surface layer of the substrate on the basis of measurement of the thickness of the surface layer of a portion of the substrate extending outwardly from the periphery of the polishing surface.

According to another aspect of the present invention, there is provided an apparatus for polishing substrates comprising: a polishing table having a polishing surface; a substrate carrier for holding a substrate, the substrate carrier being movable between a polishing position in which an entire area of a surface of a substrate to be polished is brought into contact with the polishing surface and a measurement position in which the surface of the substrate partly extends outwardly from the outer periphery of the polishing surface; and a layer thickness measuring device for determining a thickness of a surface layer of the substrate by measuring the surface layer of the portion of the substrate extending outwardly from the outer periphery of the polishing surface of the polishing table. Further, the present invention provides an apparatus for polishing substrates comprising a polishing table having a polishing surface and a transparent ring positioned outside and fixedly connected to an outer peripheral edge of the polishing surface, the transparent ring having a flat surface which is flush with the polishing surface of the polishing table. The apparatus may comprise a layer thickness measuring device disposed under the transparent ring for measuring thickness of a surface layer of the substrate. Furthermore, the apparatus comprises a substrate carrier for holding the substrate, the substrate carrier being movable between a polishing position in which an entire area of a surface of a substrate to be polished is brought into contact with the polishing surface and a measurement position in which the surface of the substrate partly extends outwardly from the outer periphery of the polishing surface. The transparent ring may be replaced by a stationary transparent member positioned outside, spaced away from and adjacent to an outer peripheral edge of the polishing surface. The stationary transparent member has a flat surface which is flush with the polishing surface of the polishing table.

Preferred embodiments of the present invention will now be described in detail with reference to the attached drawings.

BRIEF DESCRIPTION OF THE DRAWINGS

FIG. 11 is a table showing kinds of slurries, substrate carrier urging forces and numbers of revolutions per minute of the substrate carrier;

DETAILED DESCRIPTION OF THE INVENTION

Figure 2:
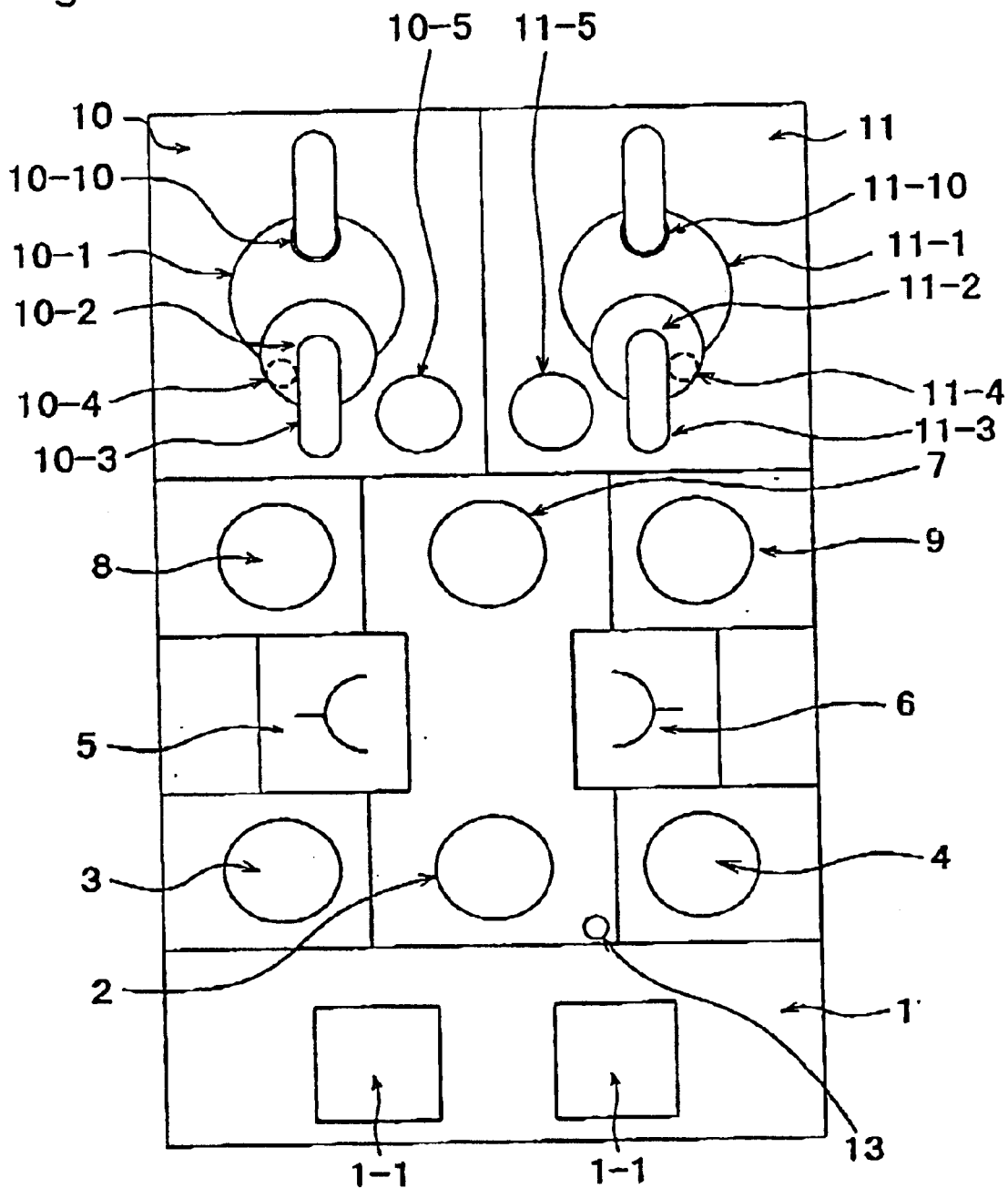
FIG. 2 is a plan view of a semiconductor processing apparatus equipped with polishing apparatuses in accordance with the present invention.

FIG. 2 is a plan view of a semiconductor substrate processing apparatus in accordance with the present invention. As shown, the substrate processing apparatus includes a loading/unloading station 1; a first robot 2; secondary cleaning devices 3 and 4; substrate reversing devices 5 and 6; a second robot 7; primary cleaning devices 8 and 9; first and second polishing apparatus 10 and 11; and a layer thickness measuring device 13.

The first polishing apparatus 10 includes a turntable 10-1 provided on its upper surface with a polishing surface; a substrate carrier 10-2 supported by a carrier support arm 10-3, a thickness measuring device 10-4; a substrate loading/unloading lift 10-5; and a polishing surface dressing or conditioning device 10-10. The second polishing apparatus 11 includes a turntable 11-1, which has a polishing surface provided on its upper surface; a substrate carrier 11-2 supported by a carrier support arm 11-3; a thickness measuring device 11-4; a substrate loading/unloading lift 11-5; and a polishing surface dressing or conditioning device 11-10.

Figure 1:
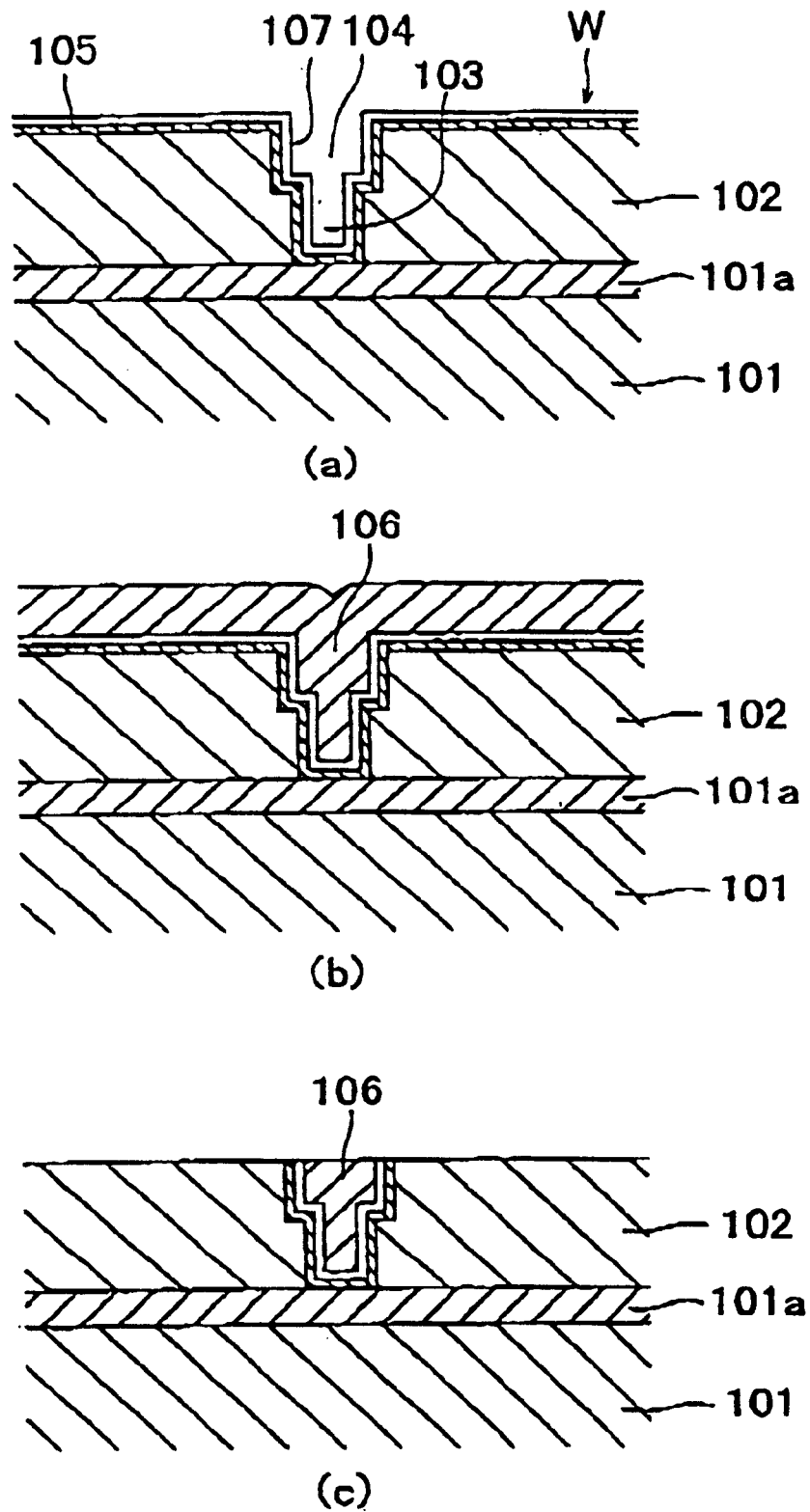
FIG. 1(a)–FIG. 1(c) are schematic cross-sectional views showing a process of forming a circuit wire or interconnect in a semiconductor substrate.

The loading/unloading station 1 is loaded with substrate cassettes 1-1 containing a predetermined number of semiconductor substrates having the same construction as that shown in FIG. 1(b), i.e., having the metal layer 106 (consisting of copper, for example) plated over the seed layer 107. The first robot 2 removes a substrate from the substrate cassette with the plated metal layer facing upwards and transfers it to either the substrate reversing device 5 or substrate reversing device 6, in which the substrate is reversed to direct the plated metal layer downwards.

The second robot 7 removes the reversed substrate from the substrate reversing device and transfers it to either the loading/unloading lift 10-5 of the first polishing apparatus 10 or the loading/unloading lift 11-5 of the second polishing apparatus 11. Using suction, the substrate carrier 10-2 or 11-2 picks up the substrate from the loading/unloading lift and brings it into contact with the polishing surface of the turntable 10-1 or 11-1 to conduct polishing of the substrate.

Figure 3:
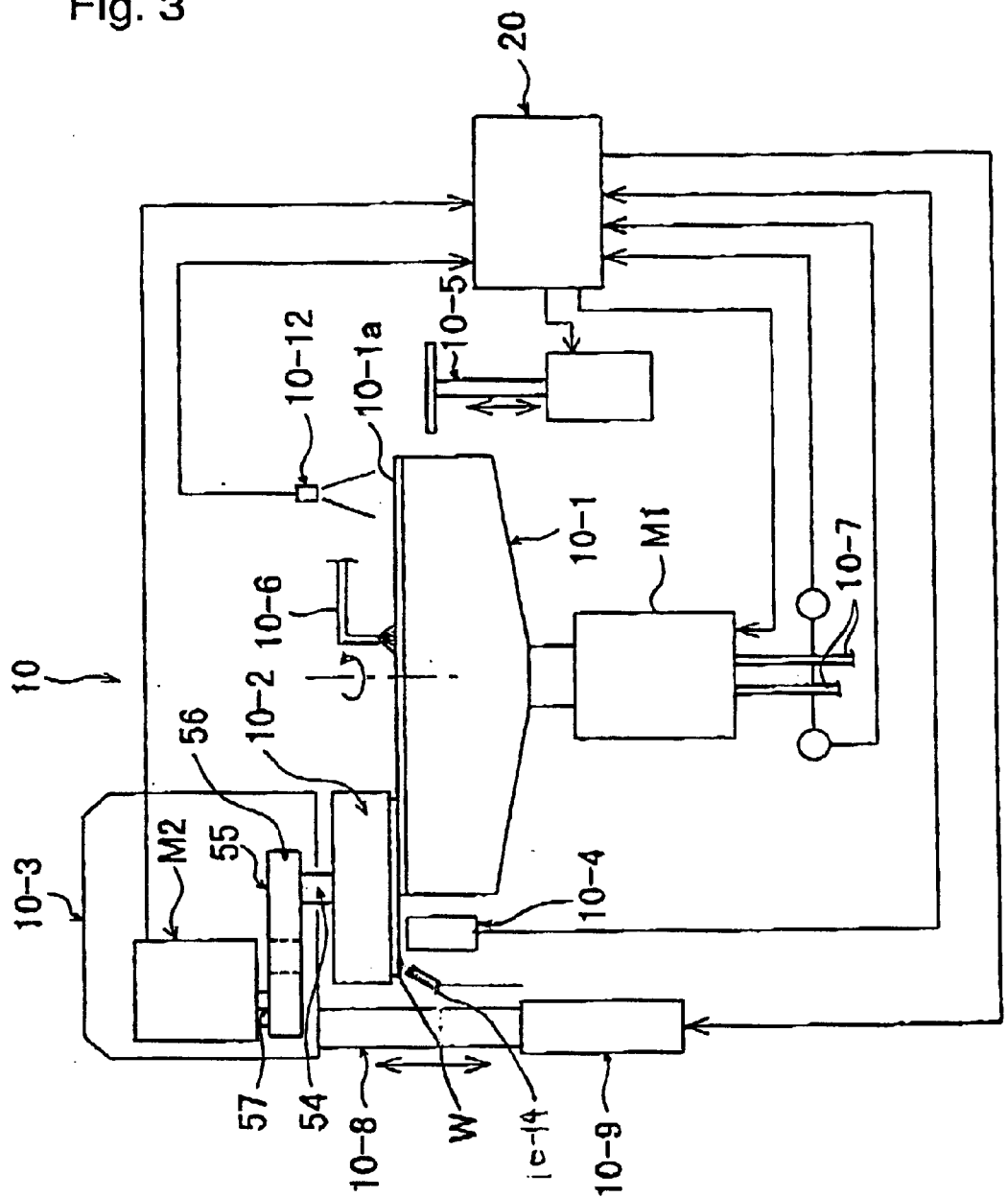
FIG. 3 is a schematic side elevation view of a polishing apparatus in accordance with an embodiment of the present invention.

FIG. 3 is a schematic view of an arrangement of the polishing apparatus 10. As shown, the turntable 10-1 and the substrate carrier 10-2 are rotated respectively by motors M1 and M2, which are controlled by a controller 20. The carrier support arm 10-3 is rotatably supported by a pivotal shaft 10-8 so that the substrate carrier 10-2 can be selectively positioned over any one of the turntable 10-1, the layer thickness measuring device 10-4 or the loading/unloading lift 10-5.

The turntable 10-1 is provided on its upper surface with a polishing pad made of porous polyurethane or a polishing member comprising fixed abrasives or impregnated abrasives by which the polishing surface 10-1a is defined. Over the polishing surface 10-1a, there is provided a slurry supply nozzle 10-6 for supplying slurry containing silica particles for use as abrasives and a polishing chemical agent such as hydrogen peroxide or ammonia. Temperatures of the turntable 10-1 and/or the slurry are controlled so as to keep constant a rate of chemical reaction occurring during a polishing process. The temperature of water used in a dressing or conditioning process of the polishing surface 10-1a may also be controlled. To this end, the turntable 10-1 is preferably made of a ceramic such as alumina or silicon carbide having a high heat conductivity, and is provided with embedded conduits for passage of water used to control the temperature of the turntable.

The carrier support arm 10-3 is adapted to be moved up and down by an actuator 10-9 which is controlled by the controller 20, whereby a wafer carried by the substrate carrier can be engaged with the polishing surface 10-1a under a desired pressure. The substrate carrier 10-2 is positioned over the turntable 10-1 in such a manner that a portion of a lower surface of the substrate carrier 10-2 extends radially outwardly from an outer periphery of the polishing surface 10-1a of the turntable 10-1. Further, an attitude of the substrate carrier 10-2 is controlled by a attitude controller which will be explained later, so that the lower surface of the same holding the substrate W is kept parallel with the polishing surface 10-1a of the turntable 10-1, whereby a contact pressure between the surface of the substrate W and the polishing surface can be made uniform across the entire area of the surface of the substrate. To readily effect attitude control, the center of the substrate W is positioned over the polishing surface 10-1a of the turntable 10-1. Furthermore, to attain a high polishing rate, the substrate W is spaced away from the center of the polishing surface 10-1a.

A layer thickness measuring device 10-4 is positioned under a portion of the substrate W extending radially outwardly from the periphery of the polishing surface of the turntable 10-1. Thus, during a polishing operation, by measuring the thickness of the surface layer of the radially outwardly extending portion of the substrate W, the measuring device 10-4 is able to take real-time measurements of a thickness of a surface layer of the substrate W. Specifically, as polishing of the substrate W proceeds, the layer thickness measuring device 10-4 measures the thickness of the plated copper layer 106, the seed layer 107 and the barrier layer 105 in sequence and, then, detects the insulating layer 102 and outputs signals indicating results of the measurement and the detection to the controller 20. To effect an appropriate measurement by the layer thickness measuring device 10-4, it is preferable to remove the slurry from the surface of the radially outwardly extending portion of the substrate W. To this end, in this embodiment, there is provided a nozzle 10-14 for directing pure water to the surface.

The layer thickness measuring device 10-4 may be an eddy current thickness measuring device in which a high-frequency current is applied to sensor coil means to cause eddy current in an electric conductive layer of the substrate such as the plated copper layer 106 or the seed layer 107 so that measurement is effected on the basis of changes in the eddy current which occur in response to changes in the thickness of the layer.

Further, the layer thickness measuring device 10-4 may be an optical thickness measuring device comprising a light emitter for directing a light beam to a surface layer of the substrate and a light receiver for receiving the light beam reflected from the layer. When the thickness of a layer becomes thinner than a predetermined value, a portion of the light beam directed to the layer passes through the surface layer and is reflected by an interface between the surface layer and a next inside layer, whereby the light receiver receives two kinds of light beams reflected by the substrate: a light beam reflected by the outer surface of the surface layer to be measured and a light beam reflected by the interface mentioned above. The thickness of the surface layer is measured by processing the two light beams.

A surface temperature of the polishing surface 10-1a is sensed by a radiation thermometer 10-12 which provides a signal indicating the surface temperature to the controller 20.

The second polishing apparatus has the same arrangement as the first polishing apparatus stated above and, thus, explanation of it is omitted.

Figure 4:
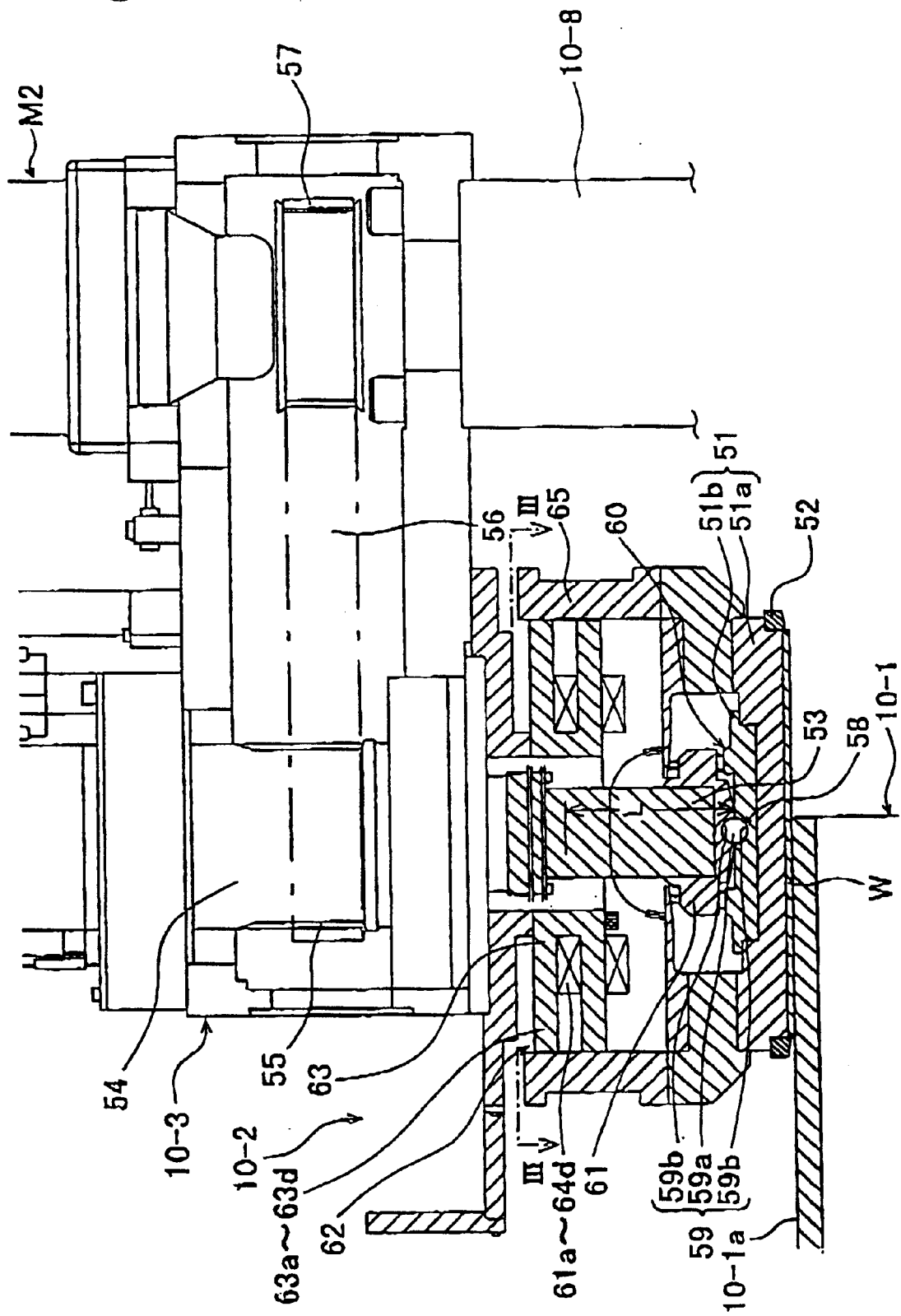
FIG. 4 is an enlarged fragmentary side elevation view of a substrate carrier of the polishing apparatus of FIG. 3.
Figure 5:
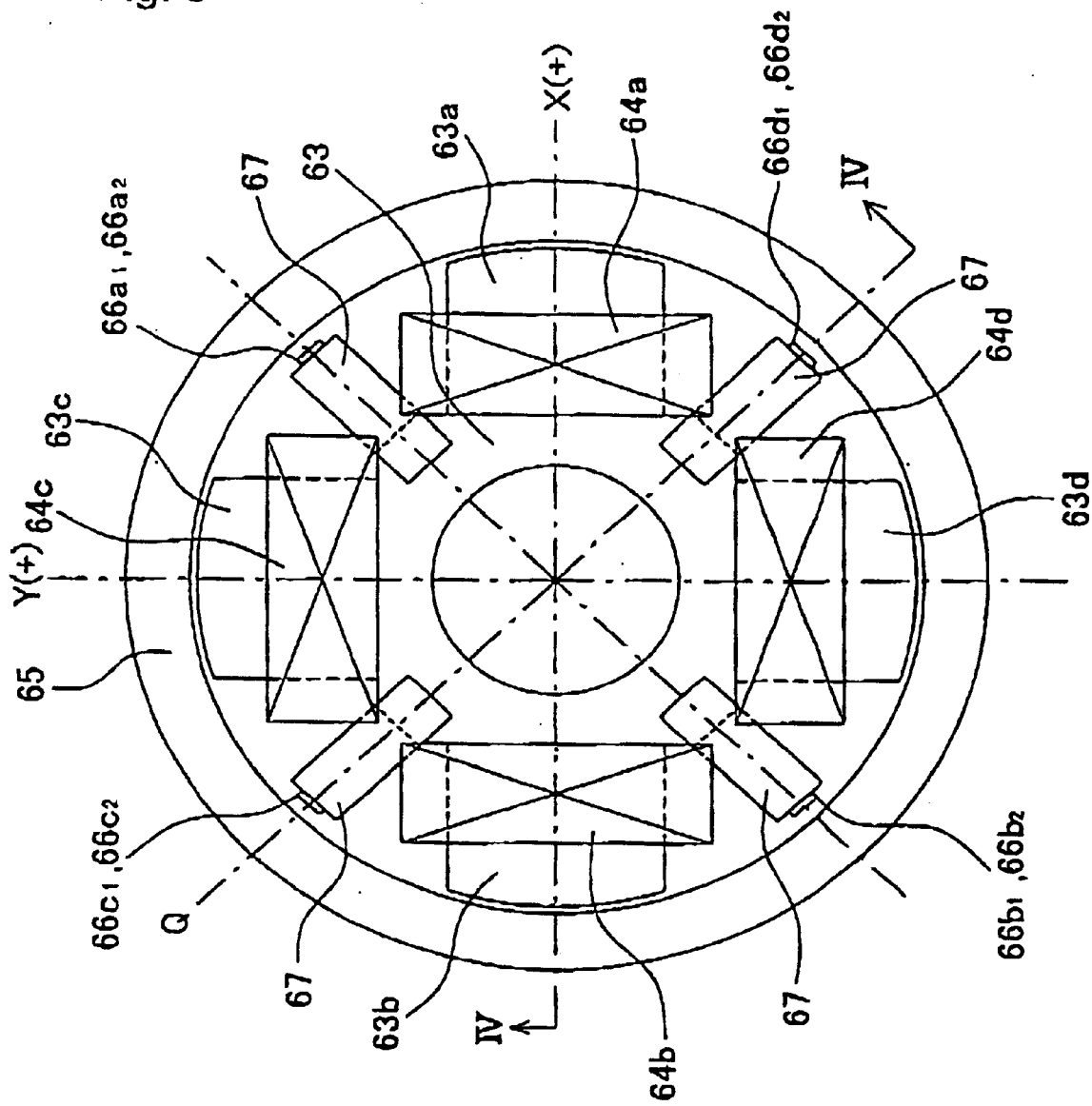
FIG. 5 is a view taken along a line III—III in FIG. 4.
Figure 6:
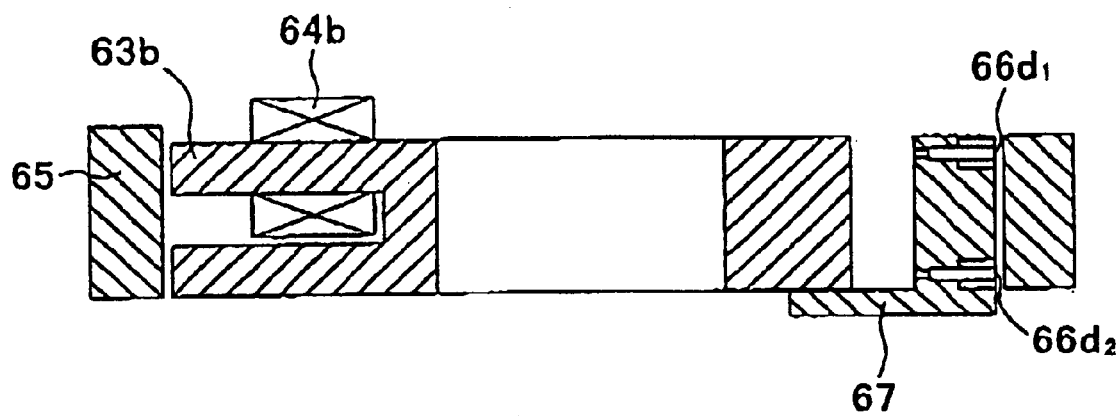
FIG. 6 is a sectional view taken along a line IV—IV in FIG. 5.

FIGS. 4–6 shows a construction of an assembly of the substrate carrier 10-2 and the carrier support arm 10-3. As shown in FIG. 4, the substrate carrier 10-2 comprises a carrier body 51, which includes a lower substrate holding member 51a and an upper connecting member 51b, with a retainer ring 52 being fixedly connected to the outer periphery of the substrate carrier 51. The lower substrate holding member 51a engages with an upper surface of the substrate W and the retainer ring 52 engages the outer peripheral edge of the substrate W to hold the substrate.

The carrier support arm 10-3 is provided with a rotational drive shaft 53 which is fixedly connected to a rotational cylinder 54 having a timing pulley 55 provided on its outer peripheral surface. The timing pulley 55 is connected through a timing belt 56 to a timing pulley 57 connected to a rotational shaft of a motor M2 which is provided on the carrier support arm 10-3. Thus, the substrate carrier 10-2 is drivingly rotated by the motor M2 through the timing pulley 57, the timing belt 56, the timing pulley 55, the rotational cylinder 54 and the drive shaft 53.

Between the drive shaft 53 and the substrate carrier body 51 there is provided a universal joint 58 for rotationally drivingly connecting the carrier body 51 to the drive shaft 53, such that the drive shaft 53 is able to transmit a downward force to the substrate carrier body 51, and the carrier body 51 is able to tilt relative to the drive shaft 53.

The universal joint 58 has a ball bearing 59 including a ball element 59a and ball element receiving recesses 59a and 59b, and a rotation transmission mechanism 60 for transmitting a rotational force of the drive shaft 53 to the substrate carrier body 51. The rotation transmission mechanism 60 consists of drive pins (not shown) securely provided on a flange 61 fixedly connected to the lower end of the drive shaft 53, and driven pins (not shown) securely provided on the upper connecting member 51b of the substrate carrier body 51, which pins are movable relative to each other in a vertical direction, when the substrate carrier body 51 tilts relative to the drive shaft 53, while keeping contact in the rotational direction to maintain the rotational driving relationship between the drive shaft 53 and the substrate carrier body 51.

The assembly of the substrate carrier 10-2 and the carrier support arm 10-3 is provided with an attitude control mechanism 62 for keeping the lower surface (or substrate holding surface) of the substrate carrier body 10-2 parallel with the polishing surface 10-1a, even under a condition in which the substrate carrier 10-2 partly extends radially outwardly from the polishing surface 10-1a of the turntable 10-1. As shown in FIGS. 4 and 5, the attitude control mechanism 62 comprises an electromagnet core 63; four magnet pole members 63a–63d extending radially outwardly from the electromagnet core 63, four electromagnetic coils 64a–64d wound around the pole members 63a–63d; and a cylindrical armature 65 positioned radially outside and encircling the pole members 63a–63d, with gaps interposed therebetween, and which is fixedly connected to the substrate carrier body 51.

As shown in FIG. 6, each of the pole members 63a–63d has radially outwardly extending upper and lower portions and is provided on its lower portion with the electromagnetic coils 64l–64d. The pole members 63a–63d and the cylindrical armature 65 are made from a magnetic material such as a permalloy. As shown in FIG. 5, the electromagnetic coils 64a–64d are positioned at equi-distant positions on an X-axis and a Y-axis relative to an origin of an X-Y coordinate shown in FIG. 5, which origin coincides with the center of the electromagnetic core 63. There are provided four pairs of positional displacement sensors $66a_1$–$66a_2$, $66b_1$–$66b_2$, $66c_1$–$66c_2$, and $66d_1$–$66d_2$, which are symmetrically placed in equi-distant positions on axes P and Q and which make an angle of 45 degrees relative to the X-axis and Y-axis. Each of the positional displacement sensors is held by a sensor holder 67.

Figure 7:
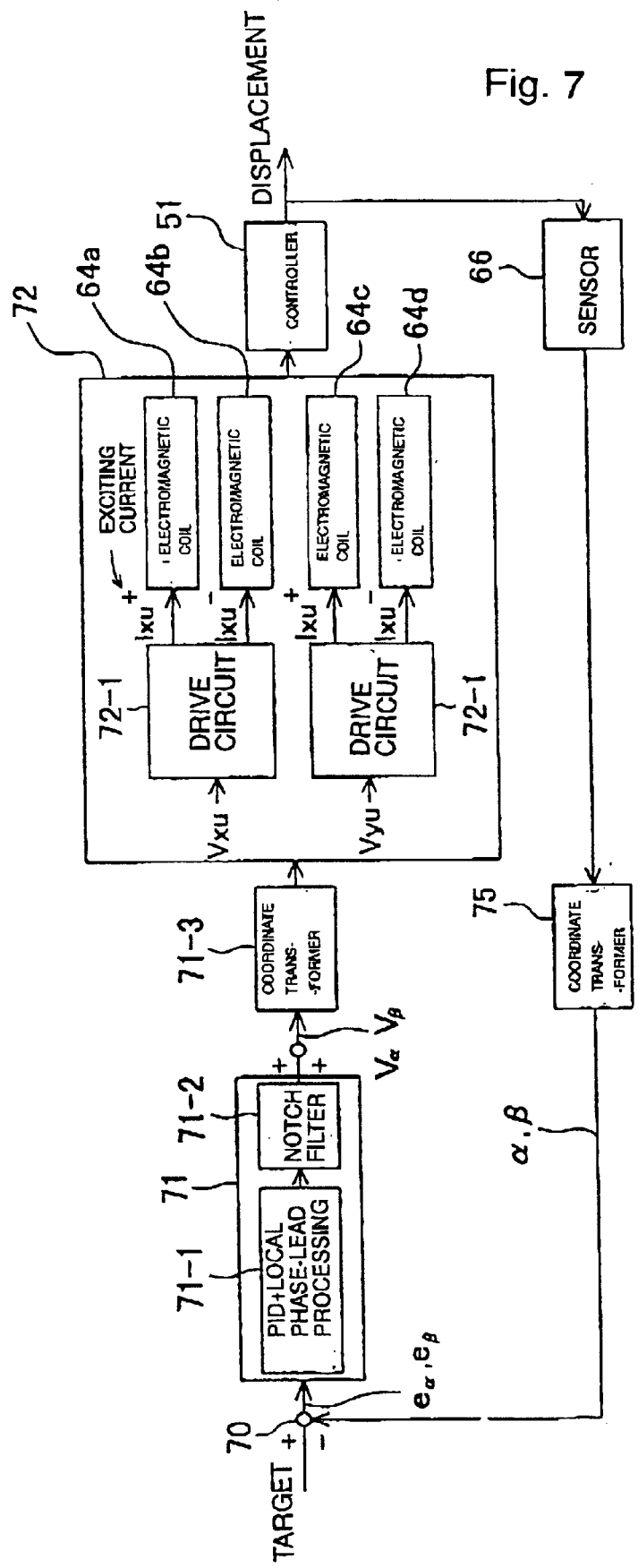
FIG. 7 is a diagram showing a functional arrangement of an attitude controller for controlling an attitude of a substrate carrier of the polishing apparatus.
Figure 8:
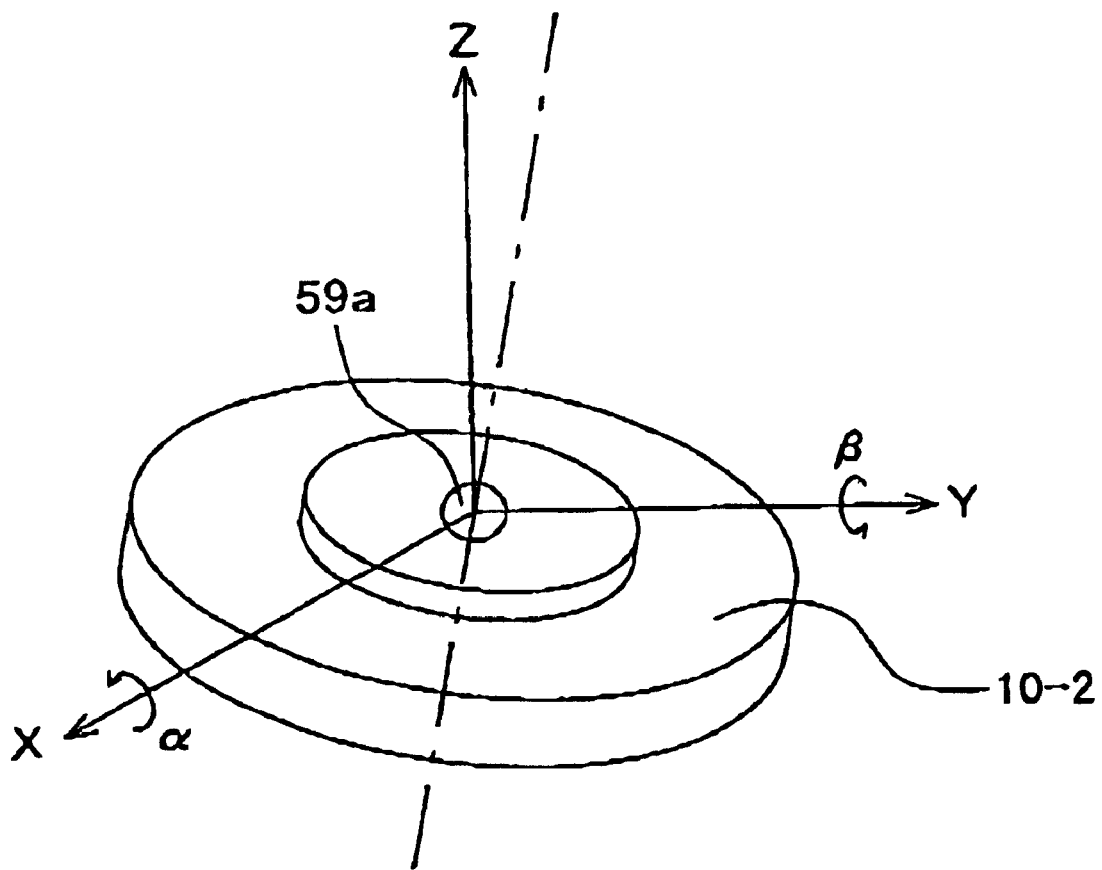
FIG. 8 is a diagram showing a relationship between $\alpha$ tilt a of the substrate carrier with respect to an X-axis and a tilt $\beta$ of the substrate carrier with respect to a Y-axis.

FIG. 7 shows a functional arrangement of the attitude control device 62. The attitude control device includes a control part comprising a subtracter 70 and a controller 71. The subtracter 70 receives target values representing a desired attitude of the substrate carrier body 51, and values a and b representing the displacement of the substrate carrier body 51, values a and b being derived from displacement values of the substrate carrier body 51 sensed by the displacement sensors 66($66a_1$–$66a_2$, $66b_1$–$66b_2$, $66c_1$–$66c_2$, $66d_1$–$66d_2$) by transforming the displacement values by means of a coordinate transformer 75. The subtracter 70 provides error signals eα and eβ representing differences between the target values and the values α and β to the control 71. The values α and β represent angular displacements of the substrate carrier body or substrate carrier 10-2 with respect to the axes X and Y of the coordinate system shown in FIG. 5, respectively. The angular displacement of the substrate carrier body is caused by a pivotal movement of the substrate carrier body about the ball element 59a of the universal joint.

The error signals eα and eβ are subjected to inclination control and attenuation processing by PID+ local phase-lead processing section 71-1 and are further passed through a notch filter 71-2 to remove vibrational components and to be transformed into voltage command signals Vα and Vβ. The command signals are then input into a coordinate transformer 71-3 to produce control signals Vxu and Vyu for supply to a drive means 72.

The drive means 72 comprises electromagnetic coils 64a, 64b, 64c and 64d and drive circuits 72-1 for energizing the electromagnetic coils. The control signals Vxu and Vyu are input into the respective drive circuits 72-1 and 72-1 to generate exciting currents Ixu+, Iku−, Iyu+, Iyu− to be supplied to electromagnetic coils 64a, 64b, 64c and 64d for adjusting the position of the cylindrical armature 65 in the X-Y coordinate system shown in FIG. 5.

In this embodiment, the center of rotation of the substrate carrier 10-2 and the plane of the X-Y coordinate system of the armature 65 are spaced apart from each other by a predetermined height. Therefore, when the armature 65 is displaced in the positive or negative direction of X-axis or Y-axis, the substrate carrier body 51 or the substrate carrier 10-2 can be tilted in a desired direction with respect to the horizontal plane about the ball element 59a acting as the center of the rotation, whereby the substrate holding surface of the substrate carrier body 51 or the surface of the substrate W to be polished can be kept parallel with the polishing surface 10-1a of the turntable, whereby contact pressure of the substrate surface against the polishing surface can be kept uniform across the entire area of the surface.

As stated above, in a polishing operation, the substrate carrier 10-2 is set to partly extend radially outwardly from the outer periphery of the turntable 10-1 and, thus, the diameter of the turntable 10-1 can be made small, whereby the size of the polishing apparatus can be reduced. For example, although in a conventional polishing apparatus in which an entire surface of a substrate to be polished is brought into contact with the polishing surface 10-1a of the turntable 10-1, the polishing surface is generally required to have a diameter of 600 mm for polishing a substrate having a diameter of 200 mm, the present invention makes it possible to reduce the diameter of the polishing surface for the same size substrate to 300 mm, i.e., a half of the conventional one.

In a process for fabricating a substrate W provided with a copper circuit wiring or interconnect 106 as shown in FIG. 1(c) by polishing a substrate as shown in FIG. 1(b), the polishing operation is conducted through a plurality of steps as follows.

In a first step, polishing is effected to remove level differences existing on the surface of the copper layer 106 of the substrate W. For example, a level difference of 700 nm on the surface of the copper layer 106 having a thickness of 100 μm is reduced to 20 nm or less by using a particular slurry suitable for removing such a level difference. In a second step, polishing is conducted under a different polishing condition to remove the remaining copper layer 106. For example, a pressure under which the substrate W is urged against the polishing surface 10-1a of the turntable 10-1 is controlled by the actuator 10-9 to be half of that in the first step or less. In the second step, the layer thickness measuring device 10-4 is used to determine an end point of polishing of the copper layer. If this second step polishing is to be ended leaving copper layer 106 with a thickness of 500 nm or more, an eddy current measuring device can be used. Alternatively, if the copper layer requires further polishing, for example to such an extent that a surface of a barrier layer 105 is revealed, an optical thickness measuring device can be used.

After removal of the copper layer through the first and second steps, the barrier layer 105 is polished. In the third step or barrier layer polishing, it sometimes becomes necessary to use another slurry when it is determined that the slurry used in the first and/or second step is not suitable for polishing the barrier layer 105. In such a case, it is required that the slurry used in the first and second steps be removed from the polishing surface of the turntable before the third step is commenced.

Figure 9:
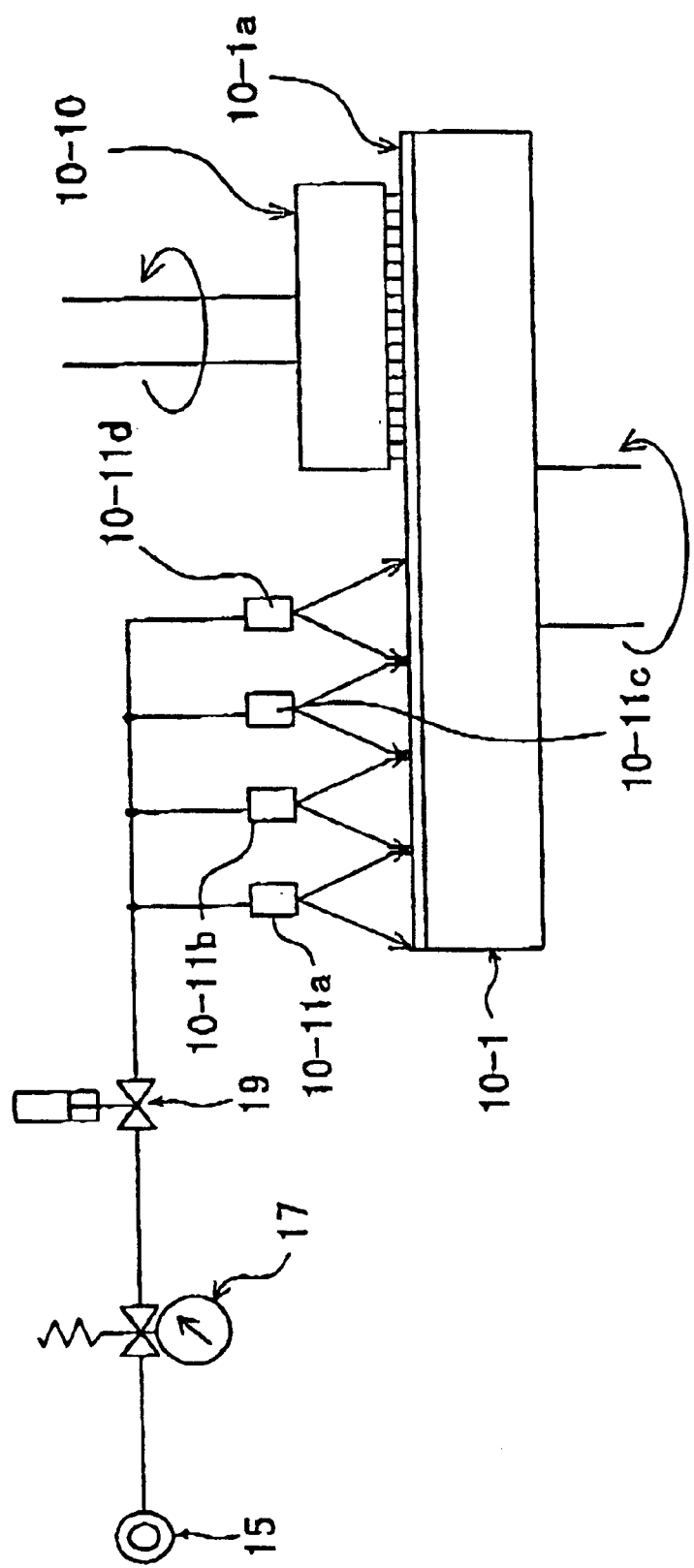
FIG. 9 is a schematic side elevation view of the polishing apparatus provided with a cleaning device for cleaning a polishing surface of a turntable of the polishing apparatus.

FIG. 9 shows a cleaning mechanism for removing the slurry from the polishing surface 10-1a. The mechanism includes a plurality (four in this embodiment) of jet nozzles 10-11a, 10-11b, 10-11c, and 10-11d for directing jets of pure water towards the polishing surface 10-1a. The jet nozzles are connected to a pure water source 15 through a regulator 17 and a valve 19.

In the embodiment shown in FIG. 9, a rotatable surface dressing or conditioning tool 10-10 is provided and, in a cleaning operation, the dressing tool is rotated while being engaged with the polishing surface 10-1a of the-turntable 10-1, which is simultaneously rotated, to thereby clean the polishing surface with the pure water being supplied by the jet nozzles 10-11a, 10-11b, 10-11c, and 10-11d. The regulator 17 may be either of an automatic control type or of a manual type. It takes, for example, between 5–20 minutes to complete the cleaning operation. The polishing apparatus 11 is, although not shown, also provided with the same cleaning mechanism. As shown in FIG. 9, the dressing tool 10-10 typically comprises a rotatable disc which is provided with, on an outer periphery of a lower surface thereof, an annular projection made of electrically deposited diamond particles. The dressing tool may consist of a disc and a number of bristles provided on the lower surface of the disc in place of the annular diamond projection stated above.

Figure 10:
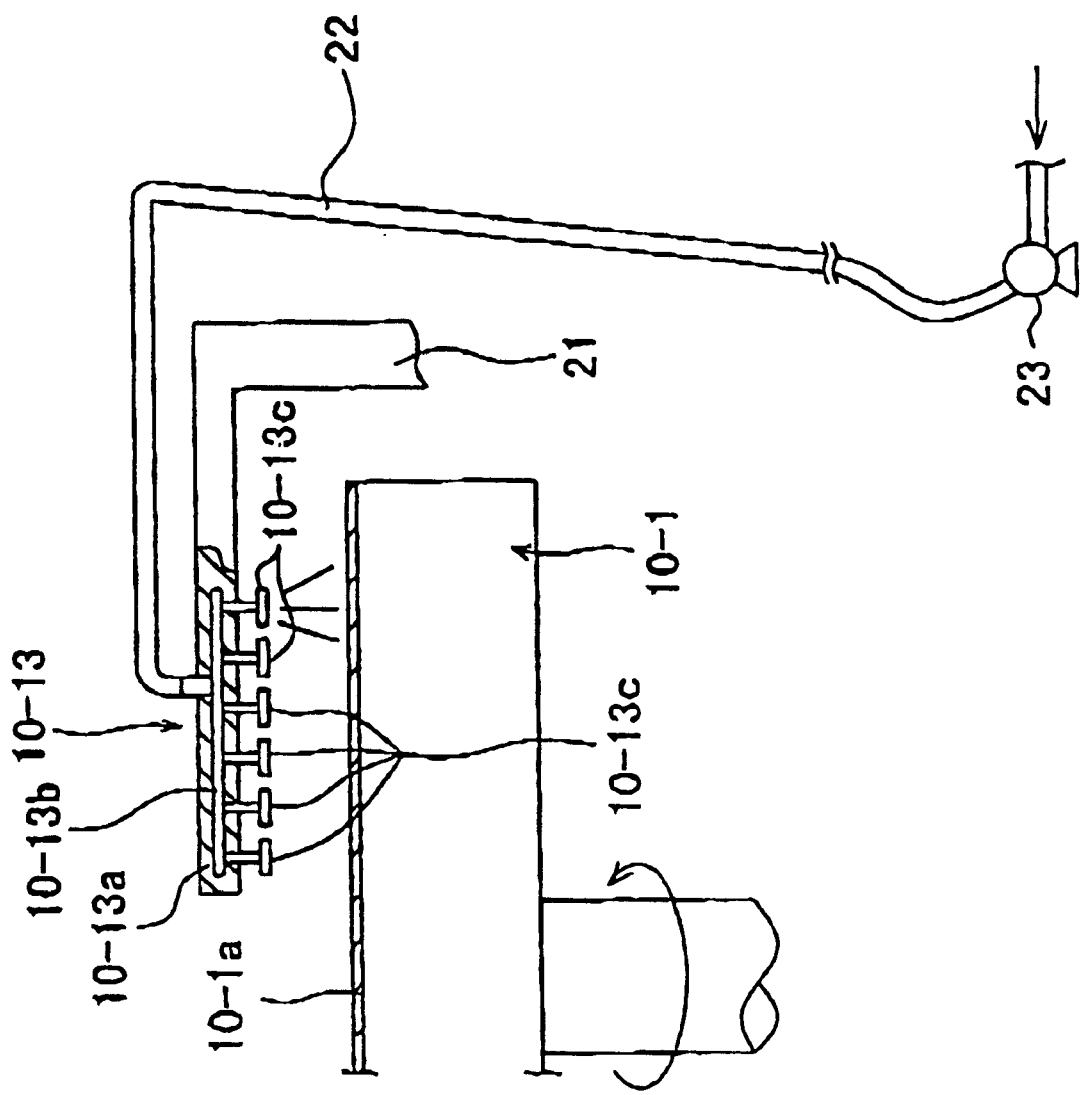
FIG. 10 is a schematic side elevation view of the polishing apparatus provided with another type of a polishing surface cleaning device.

As a means for cleaning the polishing surface of the turntable, there is another method referred to as "water polishing" in which, after third step polishing is completed, the substrate is polished continuously in the same manner as that mentioned above except that supply of the slurry is stopped and, instead, pure water is applied through the slurry supply nozzle 10-6; as a result, the polishing surface is cleaned. In this water polishing operation, the pressure under which the substrate is urged against the polishing surface is less than that employed in the first and second steps. Although in the aforementioned embodiment, application of the pure water jets and application of mechanical dressing by the dressing tool are effected together for cleaning the polishing surface 10-1a of the turntable 10-1, it is possible to effect the cleaning operation by using the pure water jets, the mechanical dressing or the water polishing or by using any one combination thereof FIG. 10 shows another embodiment of the present invention, in which a water jet dressing device 10-13 is used to clean the polishing surface of the turntable 10-1. The dressing device includes a plurality (six in the embodiment) of equally spaced water jet nozzles 10-13c provided above the polishing surface 10-1a and along a radius of the polishing surface. The water jet nozzles 10-13c are fixed on an arm 10-13a formed with water supply passages 10-13b therein. The water supply passage 10-13b is supplied with pure water through a pipe 22 to direct pure water jets towards the polishing surface through the water jet nozzles 10-13c. The pressure of the pure water supplied to the water jet nozzles 10-13c is controlled by pressure control (not shown) of a pump 23. All the water jet nozzles have the same dimensions so that flow rates and pressures of the pure water jets can be made substantially equal. It is preferable to adjust the pressure of the pure water jets to be in a range of 514 30 Kg/cm².

FIG. 11 is a diagram showing an example of polishing conditions for the first through third steps of polishing effected in accordance with the present invention. As shown, in the first step, a silica particle base slurry adjusted for copper polishing is used and a force urging a wafer against the polishing surface and a number of revolutions of the substrate carrier are set to be 400 g/cm² and 70 rpm, respectively. In the second step, the substrate urging force is changed to 200 g/cm² and the number of revolutions of the substrate carrier is changed to 70 rpm.

When the layer thickness measuring device 10-4 determines an end point of the second step of polishing, the slurry used in the first and/or second step of polishing and left on the polishing surface 10-1a is removed by employing the water polishing method, the water jet dressing method, and/or the mechanical dressing method as mentioned above. Following the cleaning operation, the polishing operation proceeds to the third step. In the third step, a silica particle base slurry adjusted for Ta or barrier layer polishing is used and a pressure under which the substrate is urged against the polishing surface and a number of revolutions of the substrate carrier are set to be 200 g/cm² and 50 rpm.

In the third step, it is preferable to use a slurry containing abrasive particles which are the same as those of the slurry used in the first and second steps for polishing. the copper layer 106 and the seed layer 107. Further, it is preferable that chemical agents added to the slurries used in the respective steps be either acid or alkaline. This makes it possible to prevent the slurry of the third step from reacting to any residue of the slurries used in the first step and/or second step remaining on the polishing surface, thereby avoiding the formation of any unwanted compound. The abrasive particles contained in the slurry may be of a different size as compared with the slurries used in the first and second steps, while it is preferable that the composition of the abrasive particles of the slurry used in the third step is the same as that of the slurries used in the first and second steps.

In the third step, since the thickness of the barrier layer 105 to be polished is relatively thin, an optical thickness measuring device is preferably used. In case the polishing surface of the turntable consists of fixed abrasives, a chemical liquid or pure water may be used instead of a slurry containing abrasive particles. It is preferable that such chemical liquids used in the first through third steps are either alkaline or acid. When a neutral chemical liquid is used in one of the steps, it is preferable to use neutral chemical liquids and/or either one of alkaline chemical liquids or acid chemical liquids in the other steps. In summary, it is desirable to avoid using both acid chemical liquids and alkaline chemical liquids in a polishing operation.

Following the polishing operation, the substrate carrier 10-2 or 11-2 returns the polished substrate to the loading/unloading lift 10-5 or 11-5 and, then, the second robot 7 transfers the substrate from the loading/unloading lift to the cleaning device 8 or 9 to conduct a primary cleaning operation of the substrate. In advance of the transfer of the substrate from the loading/unloading lift, opposite side surfaces of the substrate may be supplied with a spray of a chemical liquid which promotes separation of abrasive particles from the surfaces and/or makes it difficult for abrasive articles to adhere to the surfaces.

Figure 12:
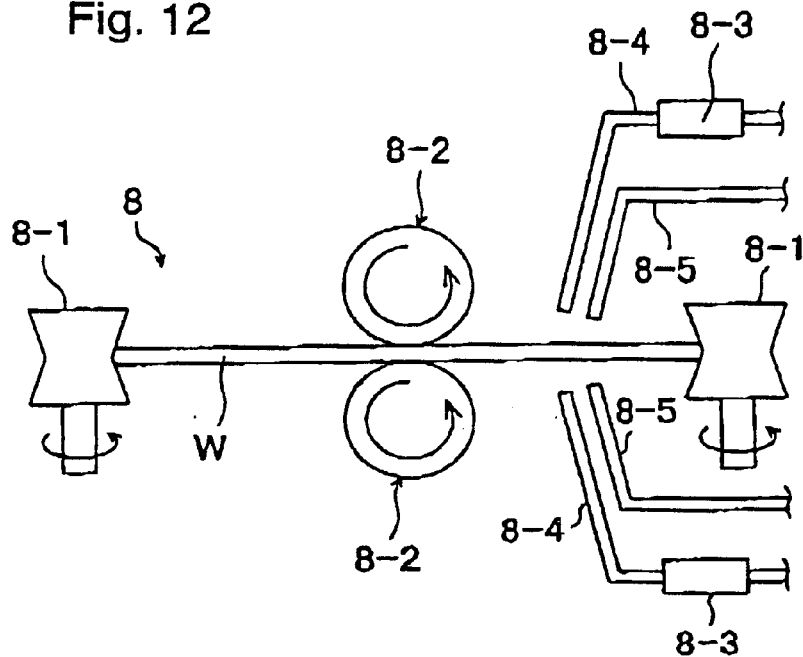
FIG. 12 is a schematic side elevation view of a primary cleaning device employed in the apparatus shown in FIG. 2.

In the primary cleaning device 8 or 9, the opposite side surfaces of the substrate are subjected to scrub cleaning. FIG. 12 schematically shows the primary cleaning device 8, in which there are provided a plurality of support rollers 8-1 engaging with the peripheral edge of the substrate W arranged in a horizontal plane and rotating around their own respective vertical axes to thereby rotate the substrate W. A pair of PVA sponge rollers 8-2 are engaged with the opposite side surfaces of the substrate W. A pair of sets of a DHF nozzle 8-5 and a positive ion water supply nozzle 8-4 are provided in such a manner that the substrate W is positioned between the sets of the nozzles 8-4 and 8-5, the water supply nozzle 8-4 being provided with an ultrasonic transducer 8-3. The upper side surface of the substrate W is supplied mainly with pure water, a surface active agent, a chelating agent and a pH adjusting agent to facilitate the PVA sponge roller 8-2 removing abrasive particles from the upper side surfaces. Although the lower side surface of the substrate is supplied with the same chemical agents as the upper side surface for removing abrasive particles using the PVA sponge roller 8-2, if there remains an amount of copper on the lower side surface, a strong acid chemical agent such as DHF is sprayed over the surface to remove the copper. The primary cleaning device 9 has the same construction as the primary cleaning device 8.

Following this primary cleaning, the second robot 7 transfers the substrate from the primary cleaning device 8 or 9 to the substrate reversing device 5 or 6 wherein the substrate is reversed or turned upside down. The first robot 2 then transfers the reversed substrate from the substrate reversing device 5 or 6 to the secondary cleaning device 3 or 4 to conduct a secondary cleaning of the substrate. The secondary cleaning devices 3 and 4, although not shown, have the same construction as that of the primary cleaning devices 8 and 9. The secondary cleaning device may employ pencil-type sponge cleaning members in place of the PVA sponge rollers, the pencil-type sponge cleaning members being supplied with pure water, a surface active agent, a chelating agent and/or a pH adjusting agent and engaged with the surfaces of the substrate to remove the abrasive particles therefrom. Following this secondary cleaning, the substrate is subjected to spin drying in the secondary cleaning device and, thereafter, is transferred to the substrate cassette 1-1 located on an unloading board in the loading/unloading station 1 by the first robot 2. However, in a case where it is required, in advance of transfer of the substrate to a process initiated after the polishing process, to determine whether the substrate has been polished appropriately and/or to store data concerning results of the polishing operation, the first robot 2 moves the substrate to the dry-condition thickness measuring device 13 for that purpose. If the measuring device determines that the substrate has not yet been polished sufficiently, the substrate is subjected to an additional polishing process. On the other hand, when the measuring device determines that the substrate has been excessively polished, the operation of the polishing apparatus is halted to prevent further production of defective substrates. The dry-condition thickness measuring device 13 may be provided with an image processing unit for conducting the thickness measurement through an image processing process.

Figure 13:
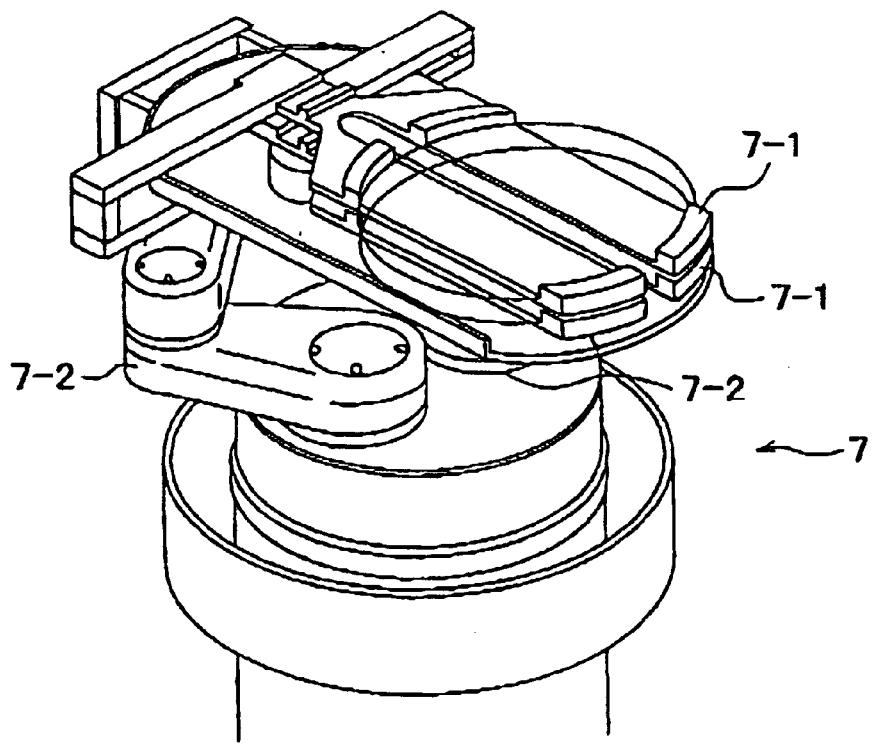
FIG. 13 is a perspective view of a robot employed in the apparatus of FIG. 2.

FIG. 13 schematically shows the second robot 7. As shown, the robot has upper and lower hands 7-1 which are respectively mounted on distal ends of corresponding arms 7-2 so that the hands can pick up a substrate and place it at a desired position after moving it.

Figure 14:
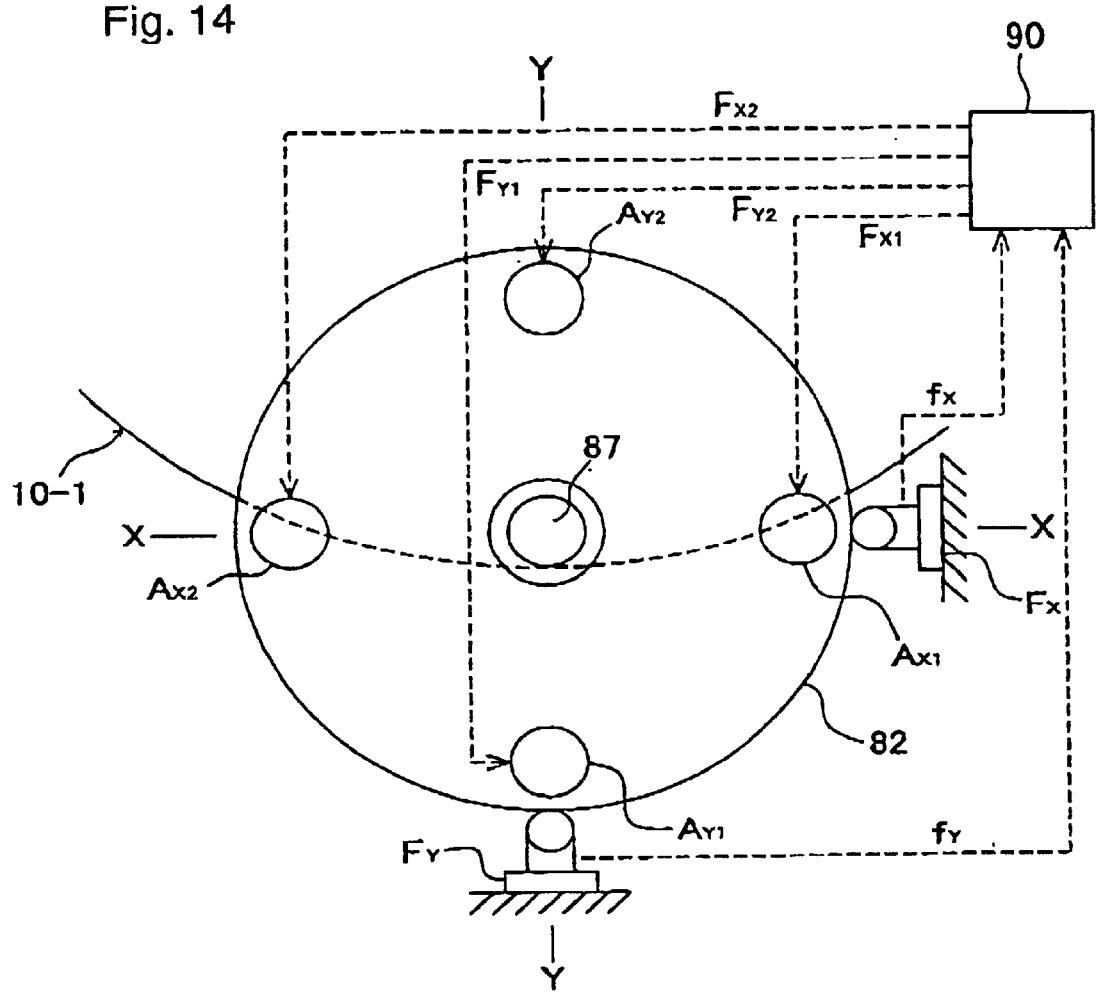
FIG. 14 is a schematic plan view of the substrate carrier provided with another type of attitude controller.
Figure 15:
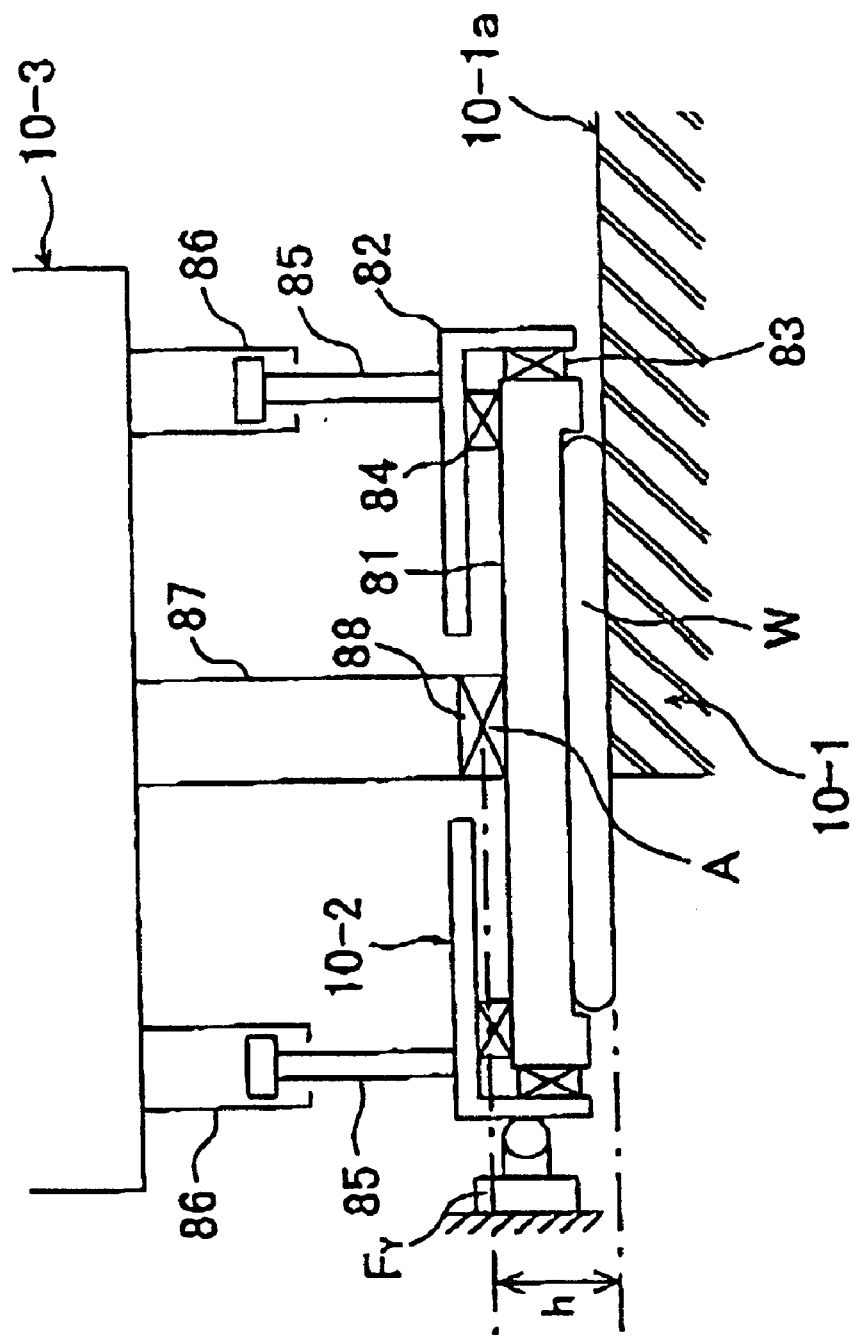
FIG. 15 is a cross sectional view taken along a line X—X in FIG. 14.

FIGS. 14 and 15 show an attitude control mechanism in accordance with another embodiment of the present invention. FIG. 14 is a schematic plan view of the attitude control mechanism and FIG. 15 is a sectional view taken along a line Y-Y in FIG. 14. As shown, a substrate carrier body 81 for holding a substrate W is arranged in such a manner that the carrier body 81 partly extends radially outwardly from the periphery of the polishing surface 10-1a of the turntable 10-1. A pressing member 82 is engaged with the upper surface and outer peripheral side surface of the substrate carrier body 81 through bearing elements 83 and 84.

The pressing member is provided on its upper surface with actuators Ax1, Ax2, Ay1 and Ay2 each comprising a cylinder 86 and a piston 85, which are arranged on a circle having a center coinciding with the center of the pressing member at an angular interval of 90 degrees, in other words, which are positioned on X-axis and Y-axis of a coordinate system having the origin coinciding with the center of the pressing member at equidistant positions relative to the origin of the coordinate system. While the pressing member 82 is stationary and connected to pistons 85, the substrate carrier body 81 is rotatably supported by the pressing member through the bearing elements 83 and 84.

Reference marks Fx and Fy denote friction sensors which sense an X-directional component fx and a Y-directional component fy of a force applied to the substrate from the polishing surface under friction generated between the substrate and the polishing surface which are moved relative to each other during polishing of the substrate. The friction sensors Fx and Fy are fixedly supported on a stationary part of the polishing apparatus in such a manner that they are positioned on the X-axis and Y-axis and adapted to engage with the periphery of the pressing member 82 through steel balls, whereby the sensors Fx and Fy can sense only X-directional component fx and Y-directional component fy of the force'applied to the substrate.

Figure 16:
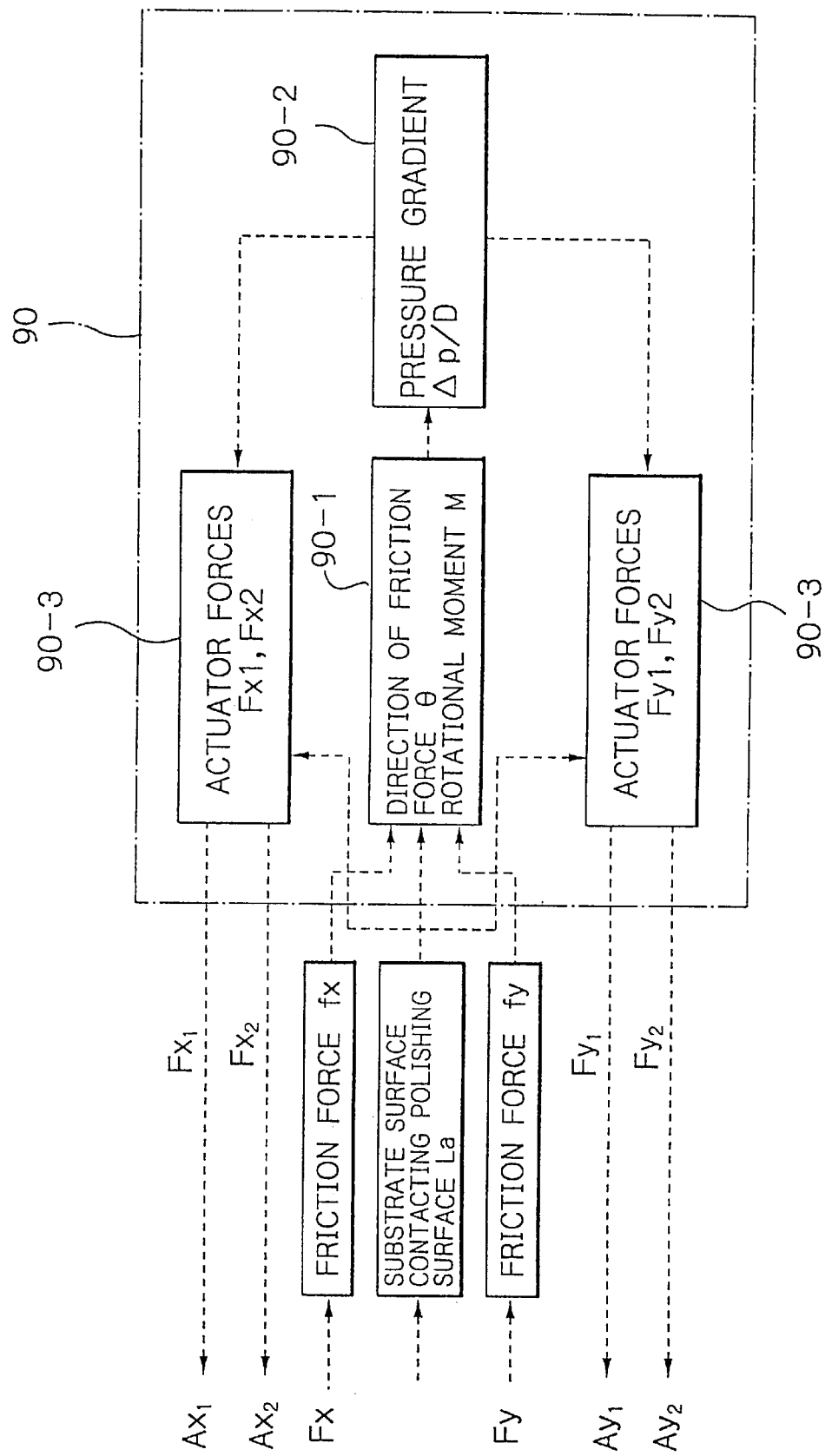
FIG. 16 is a diagram showing a functional arrangement of the attitude controller.
Figure 17:
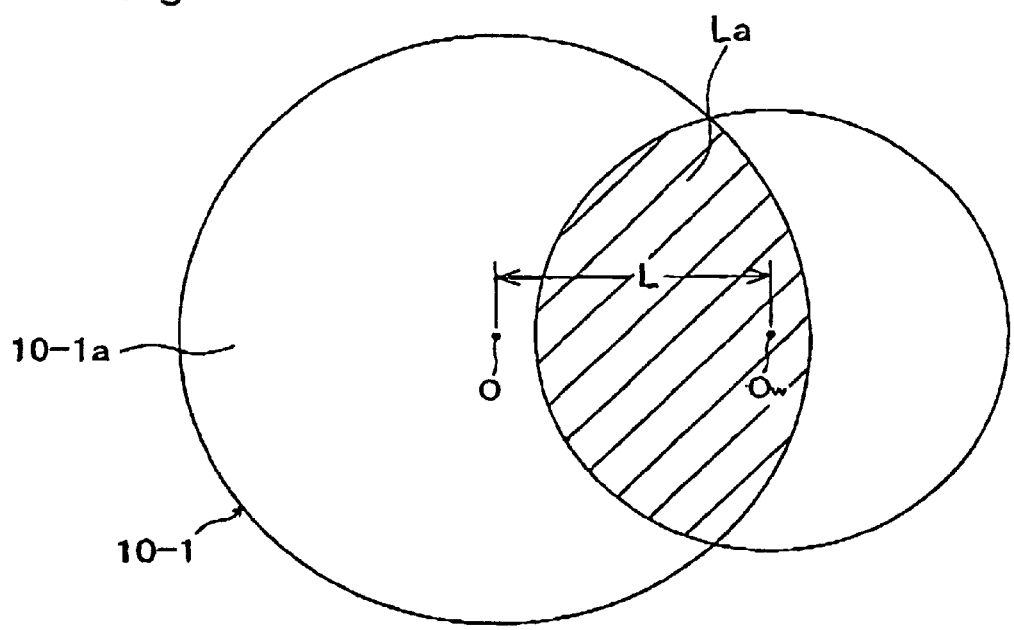
FIG. 17 is a diagram showing a relationship between the turntable and the substrate polished in accordance with the present invention.

The sensors Fx and Fy supply output signals representing the force components fx and fy to an arithmetic and control device (FIG. 16). The arithmetic and control device 90 also receives a signal representing an area La of the substrate W which is in contact with the polishing surface 10-1a *l calculated on the basis of a distance between the center Ow of the substrate W (or the center of the substrate carrier body) and the center O of the polishing surface 10-1a*. The arithmetic and control unit 90 generates signals Fx1, Fx2, Fy1 and Fy2 concerning forces to be applied to the pressing member 81 by the actuators on the basis of the inputs fx and fy and delivers them to the actuators Ax1, Ax2, Ay1 and Ay2, respectively. In FIG. 15, reference numeral 87 denotes a rotational drive shaft and reference numeral 88 denotes a universal joint corresponding to the universal joint 58 in FIG. 4.

In a polishing operation, the turntable 10-1 is rotated at a predetermined speed V and the substrate carrier body 81 is urged against the polishing surface 10-1a of the turntable under a pressing force and, thus, the substrate carrier body 81 is subject to a rotational moment M caused by a friction force f generated between the substrate W and the polishing surface 10-1a; as a result, the substrate carrier body 81 is inclined. The rotational moment M around a point A which is the center of the universal joint 88 is calculated from the following formula: M=fh, wherein h is a height of the point A from the polishing surface 10-1a. Due to the rotational moment, the pressure between the surface of the substrate W and the polishing surface becomes uneven across the surface of the substrate engaging with the polishing surface. The arithmetic and control unit 90 computes forces for canceling the rotational moment M on the basis of the outputs fx and fy of the friction force sensors Fx and Fy and supplies the actuators Ax1, Ax2, Ay1 and Ay2 with signals Fx1, Fx2, Fy1 Fy2 representing the computed forces, whereby the actuators apply the computed forces to the pressing member 82.

FIG. 16 is a block diagram showing a functional arrangement of the arithmetic and control device. As shown, in the arithmetic and control device 90, a computing unit 90-1 determines a direction θ of the frictional force and the rotational moment M on the basis of the outputs fx and fy of the friction force sensors Fx and Fy and further adjusts the direction θ and the rotational moment M taking into consideration the contact area La and the distance L mentioned above. The adjusted direction θ and rotational moment M are processed by a computing unit 90-2 to determine a pressure gradient Δp/D (in which Δp is a pressure difference and D is a diameter of the substrate W). A computing unit 90-3 computes the forces which the actuators Ax1, Ax2, Ay1 and Ay2 should apply to the pressing member 82 and transmits signals Fx1, Fx2, Fy1 and Fy2 representing the forces to the actuators Ax1, Ax2, Ay1 and Ay2. The computation of the forces is adjusted taking into consideration the contact area La.

The above-mentioned adjustment in the arithmetic and-control device 90 is effected, as the computation of the direction θ of the frictional force and the rotational moment M by the computing unit 90-1 and the computation of the forces represented by signals Fx1, Fx2, Fy1 and Fy2 by the computing unit 90-3 are effected on condition that the entire surface of the substrate W to be polished is at the same time brought into contact with the polishing surface, although the surface of the substrate is actually brought into partial contact with the polishing surface.

Upon receipt of signals Fx1, Fx2, Fy1 and Fy2, the actuators Ax1, Ax2, Ay1 and Ay2 apply the forces to the pressing member 81 so as to offset the rotational moment M, thereby preventing the substrate carrier body 81 from being inclined, and, consequently, a uniform pressure is attained across the entire surface of the substrate W which is being engaged with the polishing surface.

In the aforementioned embodiments, the attitude controllers explained with reference to FIGS. 4–8 and FIGS. 14–17 are employed to keep the substrate W parallel with the polishing surface of the turntable, because in the polishing apparatuses in accordance with those embodiments the substrate is polished while being set to partly extend radially outwardly from the outer periphery of the polishing surface of the turntable and, thus, is likely to tilt relative to the polishing surface.

Figure 18:
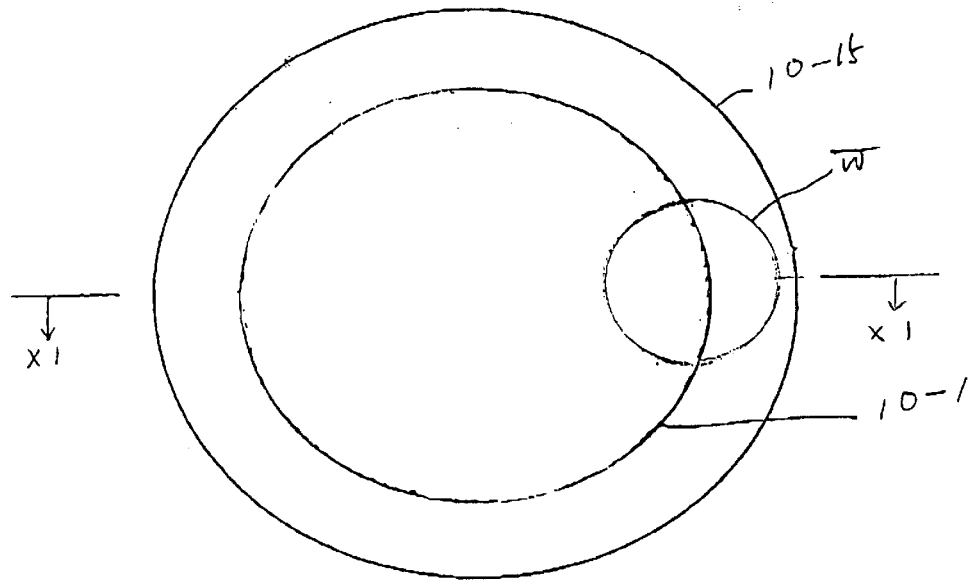
FIG. 18 is a plan view of a turntable of a polishing apparatus in accordance with another embodiment of the present invention.
Figure 19:
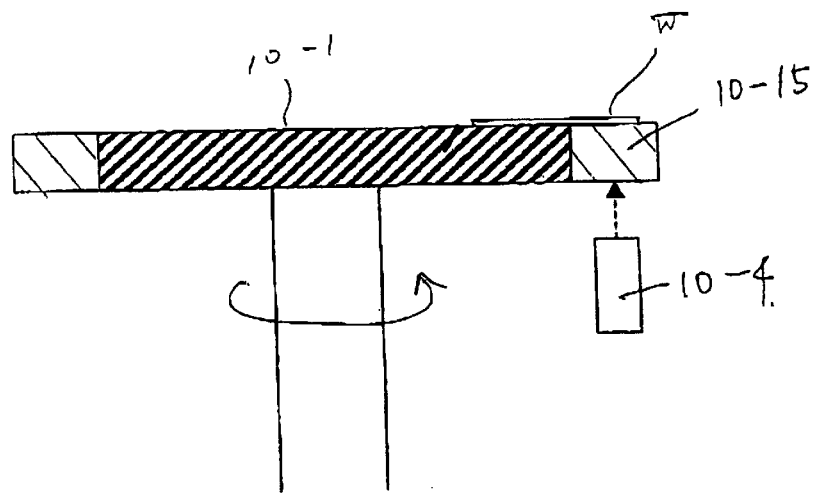
FIG. 19 is a sectional view taken along a line X1—X1 in FIG. 18.

With reference to FIGS. 18 and 19, there is shown a polishing apparatus in accordance with another embodiment of the present invention in which a substrate W is subjected to polishing while being kept parallel with a polishing surface of a turntable without employing such an attitude controller as employed in the above stated embodiments. As shown, in the polishing apparatus, the turntable 10-1 has a transparent ring 10-15, which is made-from a transparent material Such as acrylic or quartz, integrally connected to the outer periphery thereof The thickness of the ring 10-15 is the same as that of the turntable and the upper surface of the ring 10-15 is flush with the upper surface or polishing surface of the turntable 10-15. A layer thickness measuring device 10-4 is located at a position under the transparent ring 10-15. The construction of the polishing apparatus is, although not shown, the same as that of the polishing apparatuses of the embodiments stated above except for the provision of the transparent ring 10-15.

In a polishing operation, the wafer W is set to partly extend radially outwardly from the outer periphery of the polishing surface of the turntable 10-1 so that a portion of the substrate extending radially outwardly from the outer periphery of the polishing surface is subjected to measurement by the layer thickness measuring device 10-4.

In this embodiment, the portion of the substrate radially outwardly extending from the polishing surface is supported by the transparent member 10-15 and, thus, the substrate is prevented from tilting relative to the polishing surface of the turntable, thereby eliminating any need to employ the attitude controller as explained above.

Further, although in the aforementioned embodiments, in order to conduct an appropriate layer thickness measurement, it is necessary to remove the slurry from the surface of the portion of the substrate extending radially outwardly from the periphery of the polishing surface by supplying cleaning liquid such as pure water to that substrate portion, in the embodiment of FIGS. 18 and 19, the slurry on the surface of the portion radially outwardly extending from the polishing surface of the turntable is made quite thin between the surface of the partly radially extending substrate portion and the surface of the transparent ring, whereby an appropriate layer thickness measurement can be effected without removing the slurry. Accordingly, any negative influence on the slurry which might be caused when the cleaning liquid is supplied can be avoided, thereby enabling the polishing rate to be kept constant.

Figure 20:
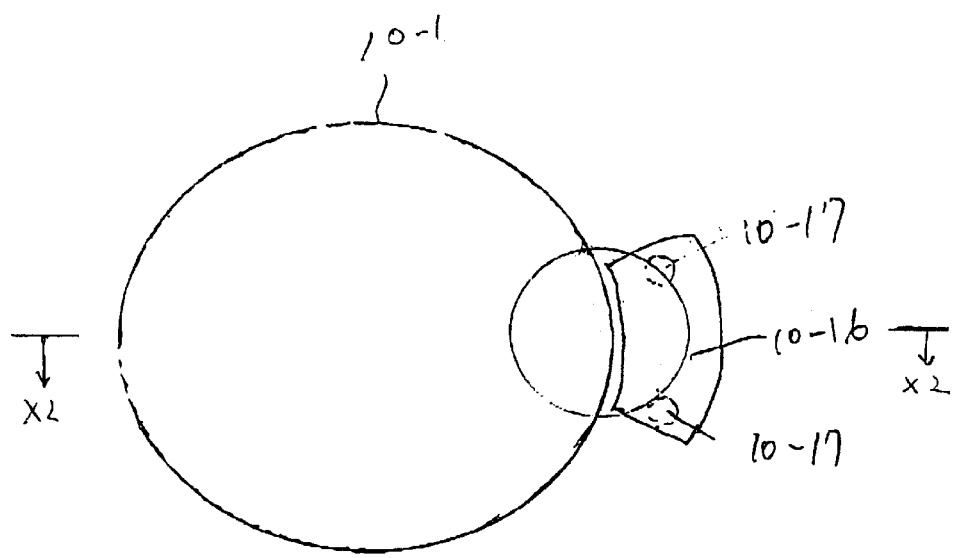
FIG. 20 is a plan view of a turntable of a polishing apparatus in accordance with a further embodiment of the present invention.
Figure 21:
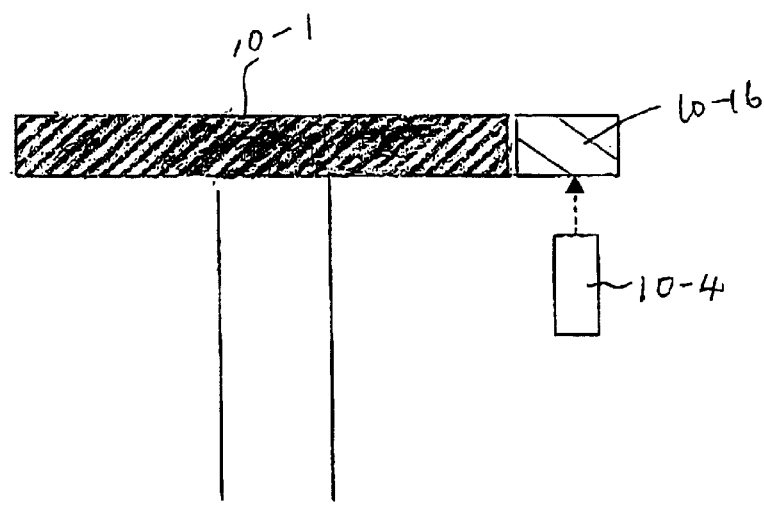
FIG. 21 is a sectional view taken along a line X2—X2 in FIG. 20

FIGS. 20 and 21 shows another embodiment in which, in place of the transparent ring 10-15, a transparent member 10-16 in the shape of a segment of a ring is provided adjacent to and spaced away from the outer periphery of the turntable and fixedly supported on a stationary frame (not shown) of the polishing apparatus by support struts 10-17. The layer thickness measuring device 10-4 is positioned under the transparent member 10-16. The radially inner edge of the transparent member 10-16 has an arch configuration corresponding to the circular outer periphery of the turntable 10-1. The upper surface of the transparent member 10-16 is flush with the upper surface or polishing surface of the turntable, whereby, as in the embodiment of FIGS. 18 and 19, it is unnecessary to employ an attitude controller or a cleaning device for cleaning the surface of the radially outwardly extending portion of the substrate for removing the slurry therefrom.

As described above, according to the present invention, during a polishing operation, a substrate W is set to partly extend radially outwardly from the periphery of the polishing surface 10-1a of the turntable 10-1. Accordingly, it becomes possible to reduce the size of the polishing surface and to set a thickness measuring device for measuring the thickness of a layer of the substrate W by simply providing the device at a position below the portion of the substrate W projecting outwardly from the periphery of the polishing surface.

By employing a layer thickness measuring device provided with an image processing apparatus, it becomes possible to effect an image recognition of a complicated circuit wiring pattern formed on a substrate by measuring the portion of the substrate radially outwardly extending from the polishing surface of the turntable. Since the semiconductor substrate is generally provided on its outer peripheral edge with a reference notch, the present invention, in which measurement by means of the thickness measuring device is conducted by viewing a portion of the substrate radially outwardly extending from the outer periphery of the polishing surface and having the above-mentioned outer peripheral edge, is suitable for effecting the image recognition processing of the circuit wiring pattern which requires a reference position defined on the substrate.

Further, in accordance with the present invention, the polishing operation is conducted through a plurality of steps by using a single polishing turntable. As a result, the size of the polishing apparatus can be reduced as compared with the prior art, in which a plurality of turntables are provided for conducting the steps of a polishing operation, and the throughput of the polishing apparatus is improved.

Although specific embodiments of the present inventions are described above, it should be noted that the present invention is not necessarily limited to these embodiments but can be modified in a variety of ways without departing from the gist of the present invention. For example, although in the embodiments described above a substrate is set to partly extend radially outwardly from the outer periphery of the polishing surface during polishing of the substrate, a modification can be made in which the substrate W is set inside the outer periphery of the polishing surface of the turntable so that the entire surface of the substrate to be polished is in contact with the polishing surface and, only when the layer thickness measurement is effected, the substrate is radially outwardly moved so that the substrate partly extends radially outwardly from the outer periphery of the polishing surface.

What is claimed is:

1. A method of polishing a substrate on which a first layer and a second layer are formed, comprising:
   bringing the substrate to be polished into contact with a polishing surface of a polishing table;
   polishing the first layer of the substrate while supplying a first polishing liquid between the first layer of the substrate and the polishing surface of the polishing table;
   cleaning the polishing surface to remove residue of the first polishing liquid from the polishing surface after said polishing the first layer; and
   polishing the second layer of the substrate while supplying a second polishing liquid between the second layer of the substrate and the polishing surface of the polishing table after said cleaning the polishing surface;
   wherein said polishing the first layer and said polishing the second layer each comprises rotating the substrate about a center axis of the substrate and controlling an attitude of the substrate with a controller; and
   wherein said polishing the first layer and said polishing the second layer each comprises the substrate extending outwardly of an outer periphery of the polishing surface of the polishing table during said polishing the first layer and said polishing the second layer.

2. The method of claim 1, wherein the center axis of the substrate is positioned on or inside the outer periphery of the polishing surface of the polishing table during said polishing the first layer and said polishing the second layer.

3. The method of claim 2, and further comprising measuring a thickness of a surface layer of the substrate by measuring the thickness of the surface layer of a portion of the substrate extending outwardly of the outer periphery of the polishing surface.

4. The method of claim 1, and further comprising measuring a thickness of a surface layer of the substrate by measuring the thickness of the surface layer of a portion of the substrate extending outwardly of the outer periphery of the polishing surface while the substrate is being rotated.

5. The method of claim 4, wherein said polishing the first layer and said polishing the second layer comprise changing polishing conditions of the substrate in response to polishing progress of the surface of the substrate by changing the force urging the surface of the substrate against the polishing surface, the number of revolutions per minute of the substrate and/or the number of revolutions per minute of the polishing table.

6. The method of claim 5, wherein said changing the polishing conditions is effected based on said measuring a thickness of a surface layer of the substrate.

7. The method of claim 1, wherein said polishing the first layer and said polishing the second layer comprise changing polishing conditions of the substrate in response to polishing progress of the surface of the substrate by changing the force urging the surface of the substrate against the polishing surface, the number of revolutions per minute of the substrate and/or the number of revolutions per minute of the polishing table.

8. The method of claim 1, wherein said cleaning the polishing surface to remove residue of the first polishing liquid from the polishing surface comprises supplying pure water to the polishing surface for removing the residue of the first polishing liquid.

9. The method of claim 8, and further comprising detecting a temperature of the first layer of the substrate during said polishing the first layer or a temperature of the second layer of the substrate during said polishing the second layer and providing the temperature that is detected to a controller for controlling polishing conditions.

10. The method of claim 1, and further comprising calculating an area of the first layer of the substrate which is in contact with the polishing surface of the polishing table during said polishing the first layer or an area of the second layer of the substrate which is in contact with the polishing surface of the polishing table during said polishing the second layer and providing the area calculated to a controller for controlling polishing conditions.

* * * * *